(12) United States Patent
Kaku et al.

(10) Patent No.: US 6,377,647 B1
(45) Date of Patent: Apr. 23, 2002

(54) PLL CIRCUIT

(75) Inventors: Takashi Kaku; Noboru Kawada; Hideo Miyazawa, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/205,804

(22) Filed: Dec. 4, 1998

(30) Foreign Application Priority Data

Jan. 9, 1998 (JP) ............................................. 10-003152

(51) Int. Cl.[7] ................................................. H03D 3/24
(52) U.S. Cl. ..................................... 375/376; 370/505
(58) Field of Search .............................. 375/376, 375; 713/400; 327/147, 151, 146, 155, 156, 159, 160, 163; 370/505, 506

(56) References Cited

U.S. PATENT DOCUMENTS

| | | | |
|---|---|---|---|
| 5,428,648 A | | 6/1995 | Fukuda |
| 5,610,952 A | * | 3/1997 | Yamanaka et al. ........... 375/371 |
| 5,740,211 A | * | 4/1998 | Bedrosian .................... 375/371 |
| 5,878,101 A | * | 3/1999 | Aisaka ........................ 377/47 |
| 5,892,405 A | * | 4/1999 | Kamikubo et al. ........... 331/14 |
| 6,031,425 A | * | 2/2000 | Hasegawa ................... 331/1 A |
| 6,236,278 B1 | * | 5/2001 | Olgaard ....................... 331/25 |

FOREIGN PATENT DOCUMENTS

| | | |
|---|---|---|
| JP | 62-43215 | 2/1987 |
| JP | 6-104741 | 4/1994 |

* cited by examiner

*Primary Examiner*—Chi Pham
*Assistant Examiner*—Phuong Phu
(74) *Attorney, Agent, or Firm*—Rosenman & Colin LLP

(57) ABSTRACT

A PLL circuit that causes an internal oscillation signal to lock to an external input clock signal, and is capable of suppressing jitter. The PLL circuit includes a frequency dividing circuit for frequency-dividing an input clock signal; a voltage-controlled oscillator; a missing-pulse clock signal creation circuit for creating, based on an output signal of the voltage-controlled oscillator, a missing-pulse clock signal having a higher speed than that of an output signal of the frequency dividing circuit and having a periodic missing-pulse portion; a phase comparator circuit for sampling the output signal of the frequency dividing circuit by using the missing-pulse clock signal; a shift register for storing a change in the output signal of the phase comparator circuit; and a digital signal processing circuit for converting a value stored in the shift register into a phase difference, and for controlling the input voltage to the voltage-controlled oscillator based on the phase difference.

10 Claims, 8 Drawing Sheets

Fig.4

| R $2^7\ 2^6\ 2^5\ 2^4\quad 2^3\ 2^2\ 2^1\ 2^0$ | J [DEGREE] | |
|---|---|---|
| 0 0 0 0   0 0 0 0 | $+q_5$ | DELAYED |
| 1 0 0 0   0 0 0 0 | $+q_4$ | ↑ |
| 1 1 0 0   0 0 0 0 | $+q_3$ | |
| 1 1 1 0   0 0 0 0 | $+q_2$ | |
| 1 1 1 1   0 0 0 0 | $+q_1$ | |
| 1 1 1 1   1 0 0 0 | $-q_1$ | ↓ |
| 1 1 1 1   1 1 0 0 | $-q_2$ | |
| 1 1 1 1   1 1 1 0 | $-q_3$ | |
| 1 1 1 1   1 1 1 1 | $-q_4$ | ADVANCED |

$0 < q_1 < q_2 < q_3 < q_4 < q_5$

PLL CIRCUIT

BACKGROUND OF THE INVENTION

1. Field of the Invention

The present invention relates to a PLL (Phase-Locked Loop) circuit that causes an internal oscillation signal to lock to an external input clock signal and, more particularly, to a PLL circuit suitable for use in a high-speed data modem.

2. Description of the Related Art

Usually, data modems are used for the transmission of data over telephone lines, leased lines, or metallic lines. Among them, data modems for use over metallic lines have improved greatly in terms of speed and, nowadays, data rates of several Mbps can be achieved. When using such a high-speed data modem by connecting it to a network-synchronized device via a digital multiplexer or the like, the modem must take as an input a high-speed network clock supplied in the form of a clock signal (ST1) from an external device, and cause its internal oscillation signal to lock to the high-speed clock.

FIG. 8 is a block diagram showing one example of a prior art PLL circuit for ST1 in a data modem. In the figure, a microprocessor (MPU) 31, to which the output of an oscillator 32 is input, judges the phase advance or delay of the output clock signal FBO3 of the PLL circuit relative to the input clock signal ST1 and performs a first-order PLL operation to increase or decrease the machine cycle used to create the output clock signal FBO1 of the MPU. Likewise, a digital signal processor (DSP) 33, to which the output of an oscillator 34 is input, judges the phase advance or delay of FBO3 relative to FBO1 and performs a second-order PLL operation to increase or decrease the machine cycle used to create the output clock signal FBO2 of the DSP. A clock generating circuit 35 generates various clocks such as the multi-chip synchronization clock FBO3, D/A conversion clock, etc.

In the ST1 PLL circuit described above, because of its operating principle, jitter equivalent to at least plus or minus one machine cycle of the DSP can occur in the D/A conversion clock. The DSP machine cycle is about 30 ns to 100 ns. Accordingly, such jitter is too large for data rates of several Mbps and can cause data errors in data transmission.

SUMMARY OF THE INVENTION

In view of the above situation, it is an object of the present invention to provide a PLL circuit capable of suppressing the jitter to a level lower than that attainable with the prior art.

To achieve the above object, according to the present invention, there is provided a PLL circuit for controlling the phase of an internal clock source based on a timing signal extracted from a received signal, comprising: a missing-pulse clock signal creation circuit for creating, based on an output signal of the clock source, a missing-pulse clock signal having a periodic missing-pulse portion; a phase comparator circuit for sampling the timing signal by using the missing-pulse clock signal; and a processing circuit for converting a signal value output from the phase comparator circuit into a phase difference, and for controlling the phase of the clock source based on the phase difference.

According to the present invention, there is also provided a data modem incorporating, as a circuit for achieving synchronization with a received signal from an external device, a PLL circuit that controls the phase of an internal clock source based on a timing signal extracted from the received signal, the PLL circuit comprising: a missing-pulse clock signal creation circuit for creating, based on an output signal of the clock source, a missing-pulse clock signal having a periodic missing-pulse portion; a phase comparator circuit for sampling the timing signal by using the missing-pulse clock signal; and a processing circuit for converting a signal value output from the phase comparator circuit into a phase difference, and for controlling the phase of the clock source based on the phase difference.

According to the present invention, there is also provided a phase control method for discriminating an excursion in the phase of a clock signal output from an internal clock source relative to the phase of a timing signal extracted from a received signal, and for controlling the phase of the clock signal relative to the phase of the timing signal, based on the result of the phase excursion discrimination, comprising the steps of: creating from the clock signal a missing-pulse clock signal having a clock signal OFF period periodically alternating with a clock signal ON period; sampling the timing signal by using the missing-pulse clock signal; and discriminating the phase excursion of the clock signal relative to the timing signal, based on the ON/OFF state of the timing signal during the ON period of the missing-pulse clock signal.

BRIEF DESCRIPTION OF THE DRAWINGS

Further features and advantages of the present invention will be apparent from the following description with reference to the accompanying drawings, in which:

FIG. 4 is a diagram showing a table for converting shift register value R to phase difference J;

DESCRIPTION OF THE PREFERRED EMBODIMENTS

The preferred embodiments of the present invention will be described below with reference to the accompanying drawings.

Figure 1:
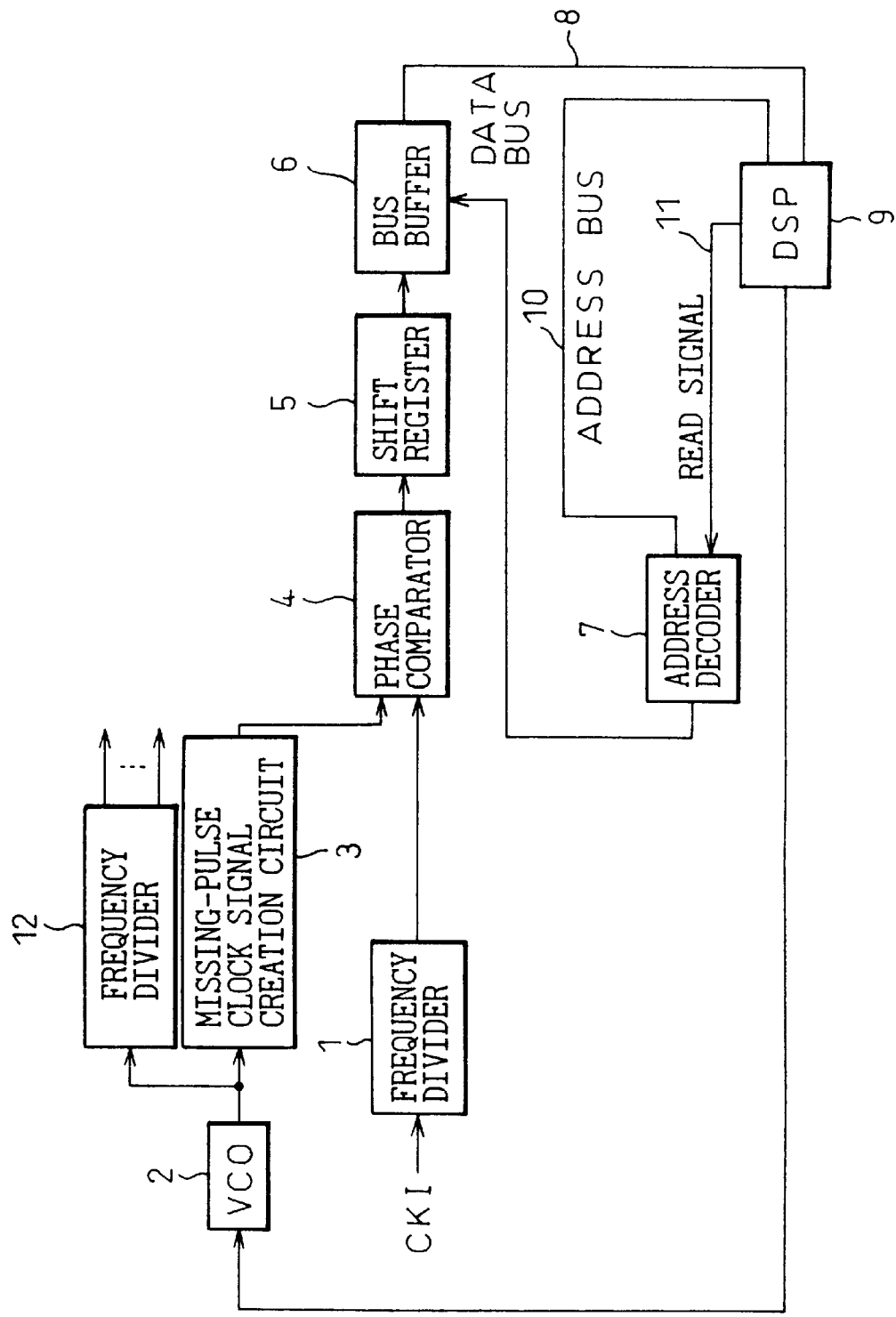
FIG. 1 is a block diagram showing a PLL circuit according to a first embodiment of the present invention.
Figure 2:
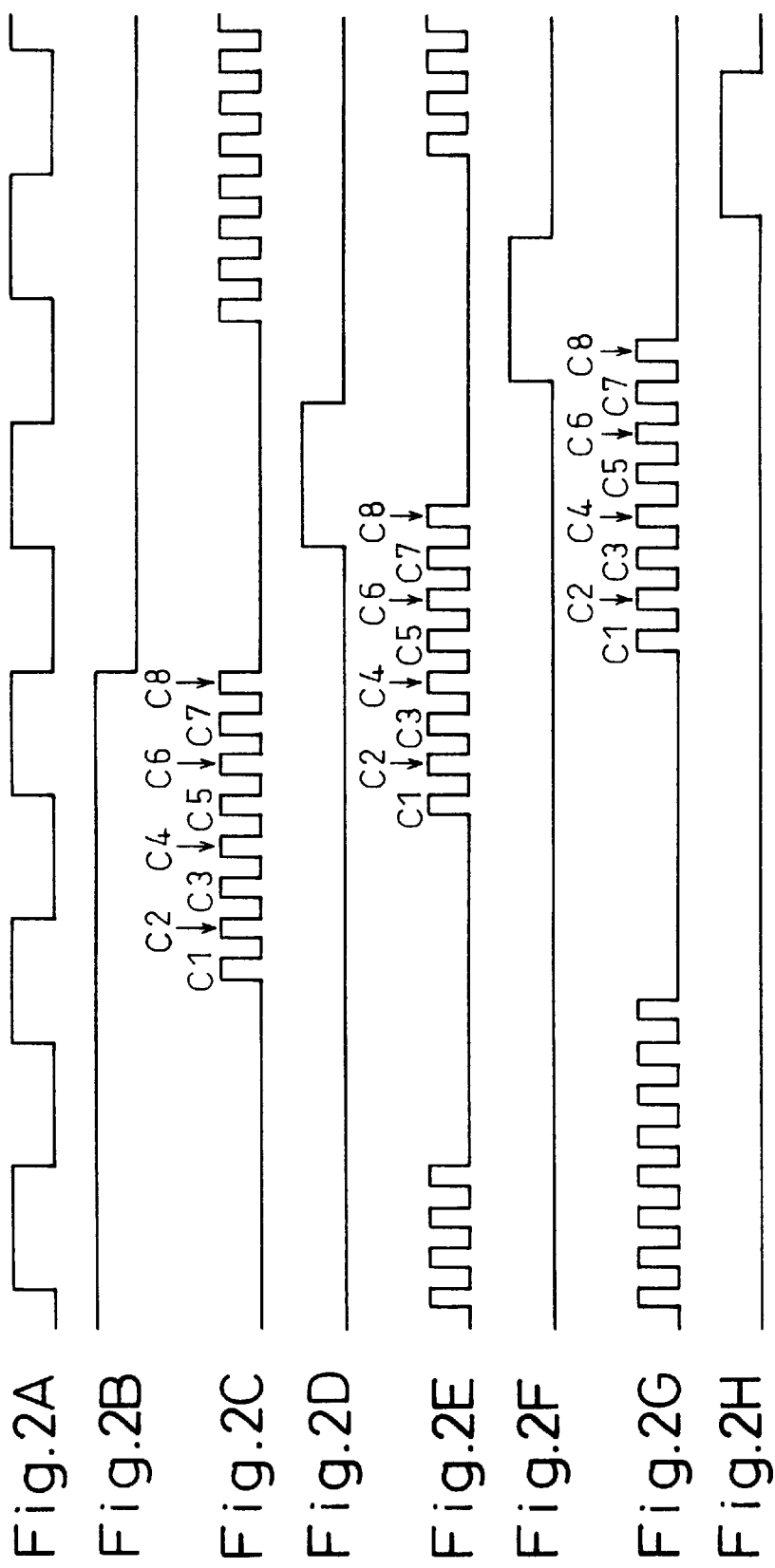
FIGS. 2A, 2B, 2C, 2D, 2E, 2F, 2G, and 2H are timing charts for explaining the operation of the PLL circuit shown in FIG. 1.

FIG. 1 is a block diagram showing a PLL circuit according to a first embodiment of the present invention, and FIGS. 2A to 2H are timing charts for explaining the operation of the PLL circuit shown in FIG. 1. In FIG. 1, a frequency dividing circuit 1 frequency-divides an external input clock signal CKI, such as shown in FIG. 2A, by a factor of eight and outputs the timing signal shown in FIG. 2B. A voltage-controlled oscillator 2 is an oscillator whose frequency of oscillation varies according to an input voltage.

A missing-pulse clock signal creation circuit 3 takes an output signal from the voltage-controlled oscillator 2 and creates a missing-pulse clock signal in which a period during which eight clock pulses occur alternates with a period of the same length during which no clock pulses occur, as shown in FIGS. 2C, 2E, and 2G. FIG. 2C shows the case in which the PLL circuit is advanced in phase relative to the input clock CKI, FIG. 2E the case in which the former is substantially in phase with the latter, and FIG. 2G the case in which the former is delayed relative to the latter.

A phase comparator circuit 4 is a flip-flop that samples the output signal of the frequency dividing circuit 1 by using the missing-pulse clock signal and holds the sampled signal. The sampled result is transferred to a shift register 5 at the following stage in synchronism with the fall of each clock pulse. More specifically, the shift register 5 is an 8-bit shift register to which a clock signal (not shown) obtained by delaying the missing-pulse clock signal by half a cycle is input as an operating clock, and which stores the output of the phase comparator circuit 4 in the least significant bit position while shifting each of the previously stored bits by one bit to a higher-order position.

A bus buffer 6 is a gate which takes an output of an address decoder 7 as an enable signal, and deposits the contents of the shift register 5 onto a data bus when the enable signal is active. The address decoder 7 is a circuit that decodes the contents of an address bus 10, and sets its output active when the address of the shift register 5 is specified and when a read signal 11 is active. A digital signal processor (DSP) 9 outputs the address specifying the shift register 5 onto the address bus 10 and, at the same time, sets the read signal 11 active to read the contents of the shift register 5.

This read operation is performed during the OFF period, i.e., the missing-pulse period, of the half-cycle delayed clock signal. For example, when the clock signal has the phase shown in FIG. 2C, the read signal 11 is set active at the timing shown in FIG. 2D; when the clock signal has the phase shown in FIG. 2E, the read signal 11 is set active at the timing shown in FIG. 2F; and when the clock signal has the phase shown in FIG. 2G, the read signal 11 is set active at the timing shown in FIG. 2H.

The reason for sampling the timing signal of FIG. 2B using the missing-pulse clock signal is to enable the phase difference (phase shift) between the internal clock signal of the PLL circuit and the timing signal extracted from the external signal to be computed based on the 8-bit information written to the shift register 5. In other words, with a clock signal with no missing pulses, there would be no reference on which to determine the occurrence or non-occurrence of a phase shift. If the timing signal of FIG. 2B is sampled using a missing-pulse clock signal having a periodicity such that each series of eight clock pulses is followed by an OFF period, as in the present embodiment, the occurrence or non-occurrence of a phase shift can be determined based on the results of the sampling.

For example, consider the case where the missing-pulse clock signal has the phase shown in FIG. 2C in relation to the phase of the timing signal shown in FIG. 2B. Since the phase comparator circuit 4 is a flip-flop that accepts the timing signal at its "data input" terminal and the missing-pulse clock signal at its "clock input" terminal, in the case of FIG. 2C the values sequentially set in the phase comparator circuit 4 in response to the clock pulses C1, C2, . . . , and C8 of the missing-pulse clock signal are all is, and the value of the shift register 5 after the phase comparison by the eight clock pulses is "11111111".

On the other hand, when the missing-pulse clock signal has the phase shown in FIG. 2E in relation to the phase of the timing signal shown in FIG. 2B, is are sequentially set in the phase comparator circuit 4 for the clock pulses C1, C2, C3, and C4 of the missing-pulse clock signal while 0s are sequentially set in the phase comparator circuit 4 for the clock pulses C5, C6, C7, and C8; accordingly, the value of the shift register 5 holding the results is "11110000". Further, when the missing-pulse clock signal has the phase shown in FIG. 2G in relation to the phase of the timing signal shown in FIG. 2B, the values sequentially set in the phase comparator circuit 4 in response to the clock pulses C1, C2, . . . , and C8 of the missing-pulse clock signal are all 0s, and therefore, the value of the shift register 5 is "00000000". In this way, the phase comparator circuit 4 is a flip-flop that temporarily holds the value used for phase comparison, and the shift register 5 is a circuit that stores the result of the phase comparison.

Accordingly, as the value of the shift register 5 to be read by the DSP 9, there are nine possible values, "00000000", "10000000", "11000000", . . . , "11111111", according to the amount of advance or delay in the phase of the PLL circuit. Here, "00000000" corresponds to the state in which the phase of the PLL circuit is the most delayed, and "11111111" to the state in which the phase of the PLL circuit is the most advanced. Based on the value of the shift register 5, the DSP 9 determines the amount of advance or delay in the phase of the PLL circuit relative to the phase of the input clock signal CKI, and thus controls the input voltage to the voltage-controlled oscillator 2 by feedback. Once phase lock is established in this way, the output of the voltage-controlled oscillator 2 is supplied to the frequency dividing circuit 12 which then creates the necessary timing clock signal and delivers it outside the PLL circuit.

Figure 3:
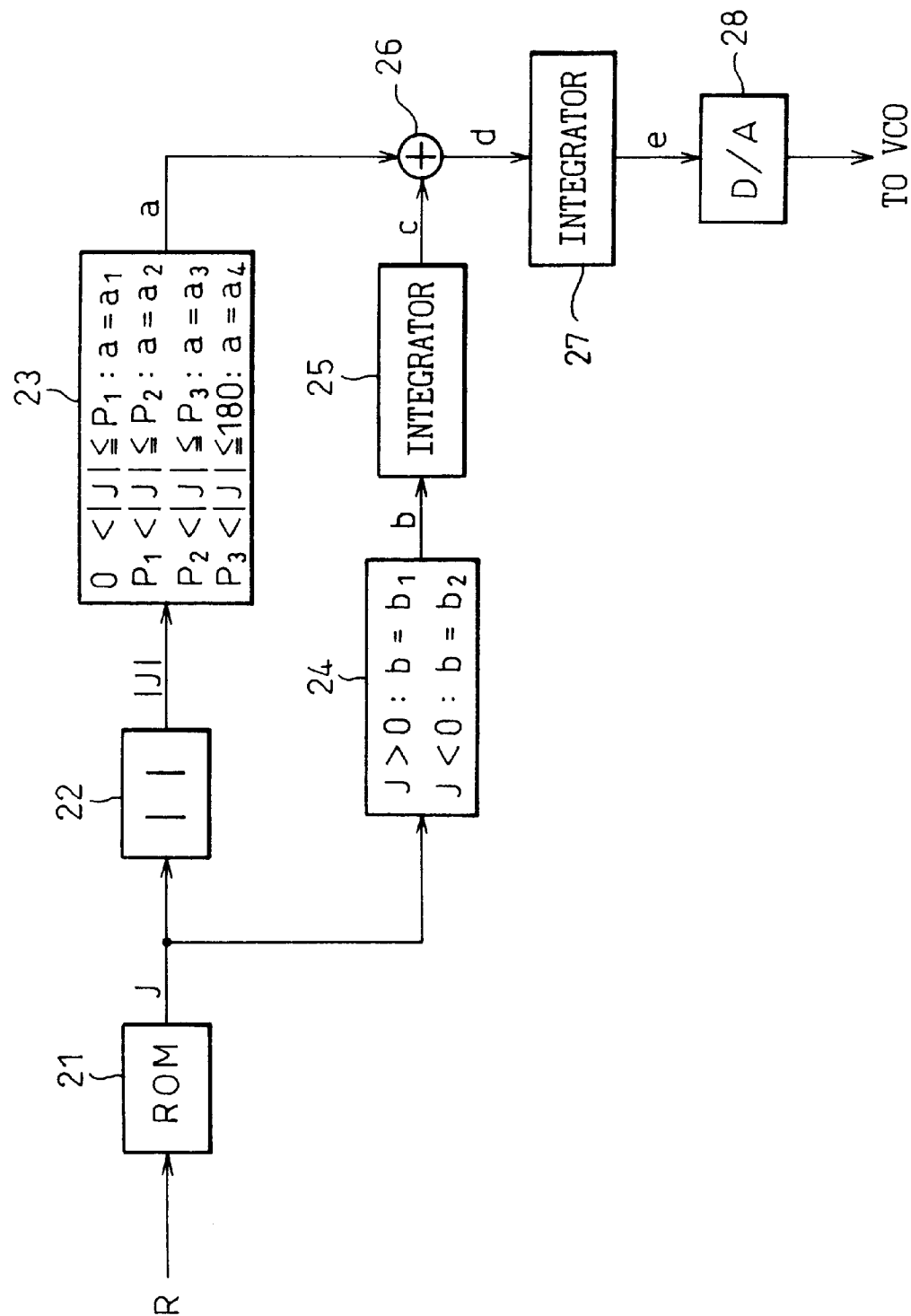
FIG. 3 is a block diagram showing the processing functions of a DSP in the form of an equivalent circuit.

FIG. 3 is a block diagram showing, in equivalent circuit form, the processing functions implemented primarily in firmware within the DSP 9. FIG. 4 is a diagram showing a table for converting the value R of the shift register 5 to the phase difference J. In FIG. 3, the value R read from the shift register 5 is input as an address to a ROM 21 which in response outputs one of the values, $-q_4, -q_3, \ldots,$ or $+q_5$, as the phase difference J between the PLL circuit and the input clock. When the value R of the shift register 5 is "11110000" or "00001111", the phase difference is closest to zero.

An absolute value circuit 22 creates the absolute value |J| of the phase difference J. A control coefficient generating circuit 23, which generates a control coefficient based on the absolute value of the phase difference, maps |J| to one of four regions, i.e., $0<|J| \leq P_1$, $P_1<|J| \leq P_2$, $P_2<|J| \leq p_3$, or $p_3<|J| \leq 180$, and sets the value of the control coefficient a to $a_1, a_2, a_3$, or $a_4$ according to which region the absolute value is mapped. Here, the values of $a_1, a_2, a_3$, and $a_4$ are determined so that the control coefficient a becomes larger in value as the absolute value of the phase difference increases. In the present embodiment, three threshold values, $P_1, P_2$, and $p_3$, are set to provide four regions, and the control coefficient appropriate to the absolute value of the phase difference is determined according to the region, but it will be appreciated that the number of such regions is not limited to four. The point here is that as the absolute value of the phase difference increases, the control coefficient a is made larger to increase the amount of feedback.

A control coefficient generating circuit 24, which generates a control coefficient based on phase advance or delay, outputs a value $b_1$ as the control coefficient b when the phase of the PLL circuit is delayed, that is, when the phase difference J is positive, and outputs a value $b_2$ as the control coefficient b when the phase of the PLL circuit is advanced, that is, when the phase difference J is negative. A first integrator 25 integrates the control coefficient b to suppress and smooth variations in the control coefficient b, and outputs a control coefficient c.

The control coefficients a and c are added together by an adder 26 which thus outputs a control coefficient d. A second integrator 27 integrates the control coefficient d to suppress and smooth variations in the control coefficient d, and outputs a control coefficient e. Finally, a D/A converter 28 converts the control coefficient e into an analog value which is supplied to the voltage-controlled oscillator 2. That is, the control coefficient e is used to control the input voltage to the voltage-controlled oscillator 2, the input voltage increasing with increasing value of e. When the input voltage is increased, the oscillation frequency of the voltage-controlled oscillator 2 increases to advance the phase; when the input voltage is decreased, the oscillation frequency decreases to delay the phase.

Figure 8:
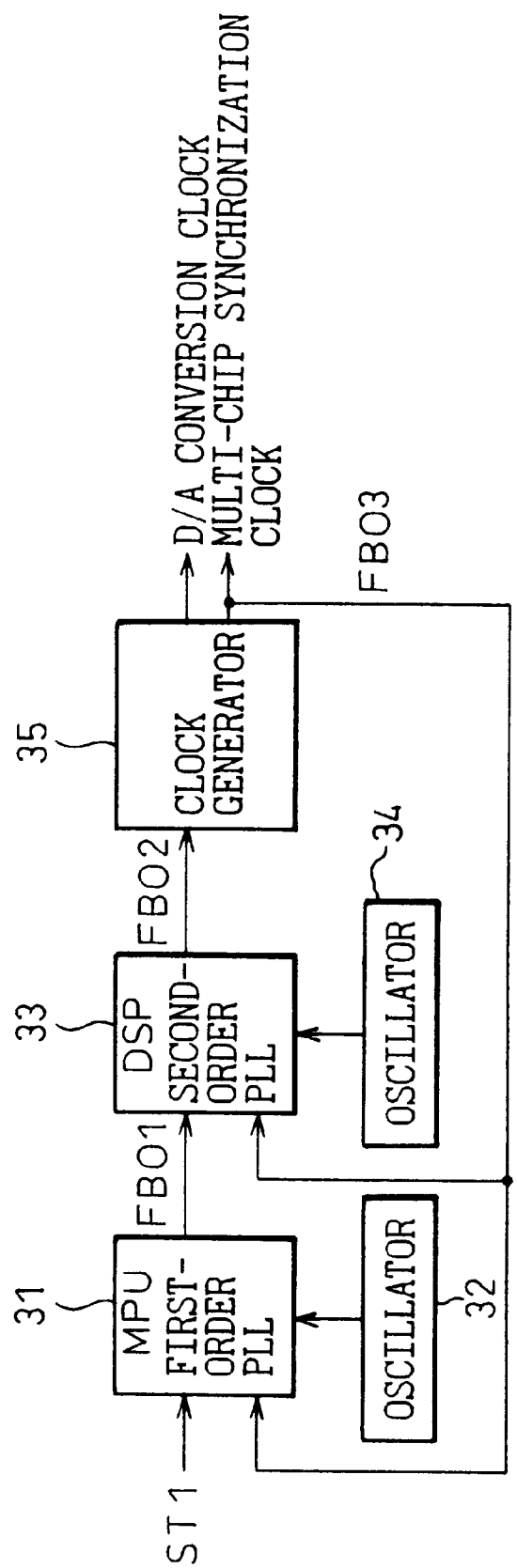
FIG. 8 is a block diagram showing one configurational example of a prior art ST1 PLL circuit in a data modem.

In this way, the PLL circuit establishes synchronization with the input clock signal CKI, and the contents of the shift register 5 only change between the values of "11110000" and "11111000". When the DSP machine cycle is, for example, ±28.6 ns, in the prior art PLL circuit shown in FIG. 8 a minimum of ±28.6 ns of jitter can occur theoretically; on the other hand, according to the PLL circuit of the present embodiment, since the phase adjustment is performed using the voltage-controlled oscillator, a clock source capable of continuously controlling its oscillation frequency, it has been verified experimentally that only ±12.0 ns of jitter, at maximum, can occur.

Generally, an analog PLL circuit performs phase control using an analog phase comparator circuit, a low-pass filter, and a voltage-controlled oscillator, while a digital PLL circuit accomplishes the same operations digitally. It can be said that the PLL circuit of the present invention is a hybrid type.

Figure 5:
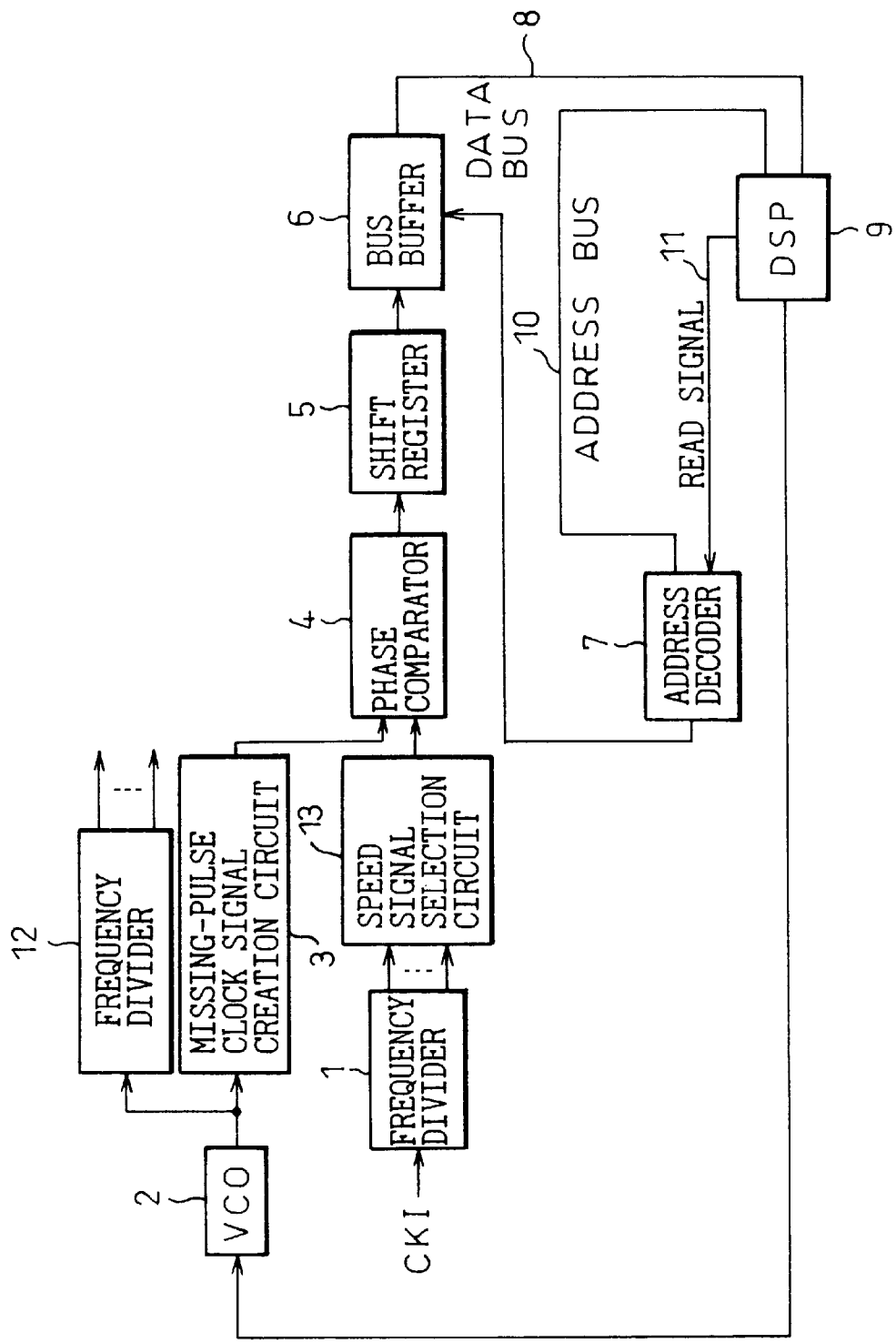
FIG. 5 is a block diagram showing a PLL circuit according to a second embodiment of the present invention.

FIG. 5 is a block diagram showing a PLL circuit according to a second embodiment of the present invention. The second embodiment further includes a means for providing a variable divide-by ratio in the frequency dividing circuit 1 so that input clock signals at different speeds can be accommodated. In the circuit of FIG. 5, the frequency dividing circuit 1 outputs a plurality of frequency-divided signals with different divide-by ratios for the input clock CKI. Then, a speed signal selection circuit 13, based on the value set by a prescribed hardware configuration means such as a dip switch, selects one of the plurality of frequency-divided signals for supply to the phase comparator circuit 4.

In this way, even if the received signal has a different frequency, the frequency output from the speed signal selection circuit can be controlled to a constant value, eliminating the need to modify other circuit elements and thus enabling input clock signals with different speeds to be supported. For example, if the frequency of the external clock signal is doubled and a frequency-divided signal whose divide-by ratio is doubled is selected, the PLL circuit can operate in the same manner as described previously.

Figure 6:
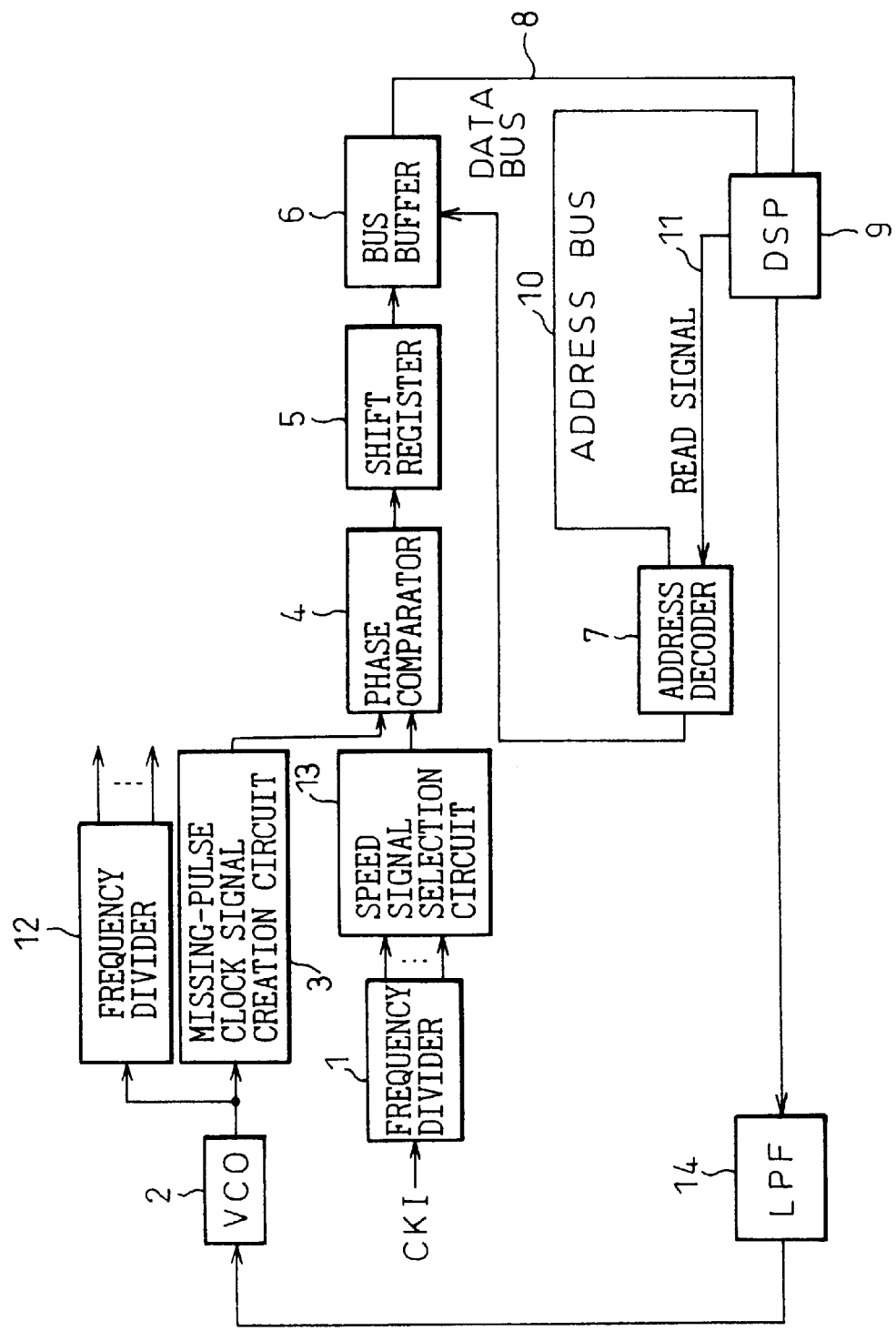
FIG. 6 is a block diagram showing a PLL circuit according to a third embodiment of the present invention.

FIG. 6 is a block diagram showing a PLL circuit according to a third embodiment of the present invention. The circuit of FIG. 6 differs from the circuit of FIG. 5 only in that a low-pass filter (LPF) 14 is provided between the DSP 9 and the voltage-controlled oscillator 2. In the third embodiment, the analog voltage signal is passed through the LPF 14 where its high-frequency components are removed before it is applied to the voltage-controlled oscillator 2. The result is improved resistance to noise.

Figure 7:
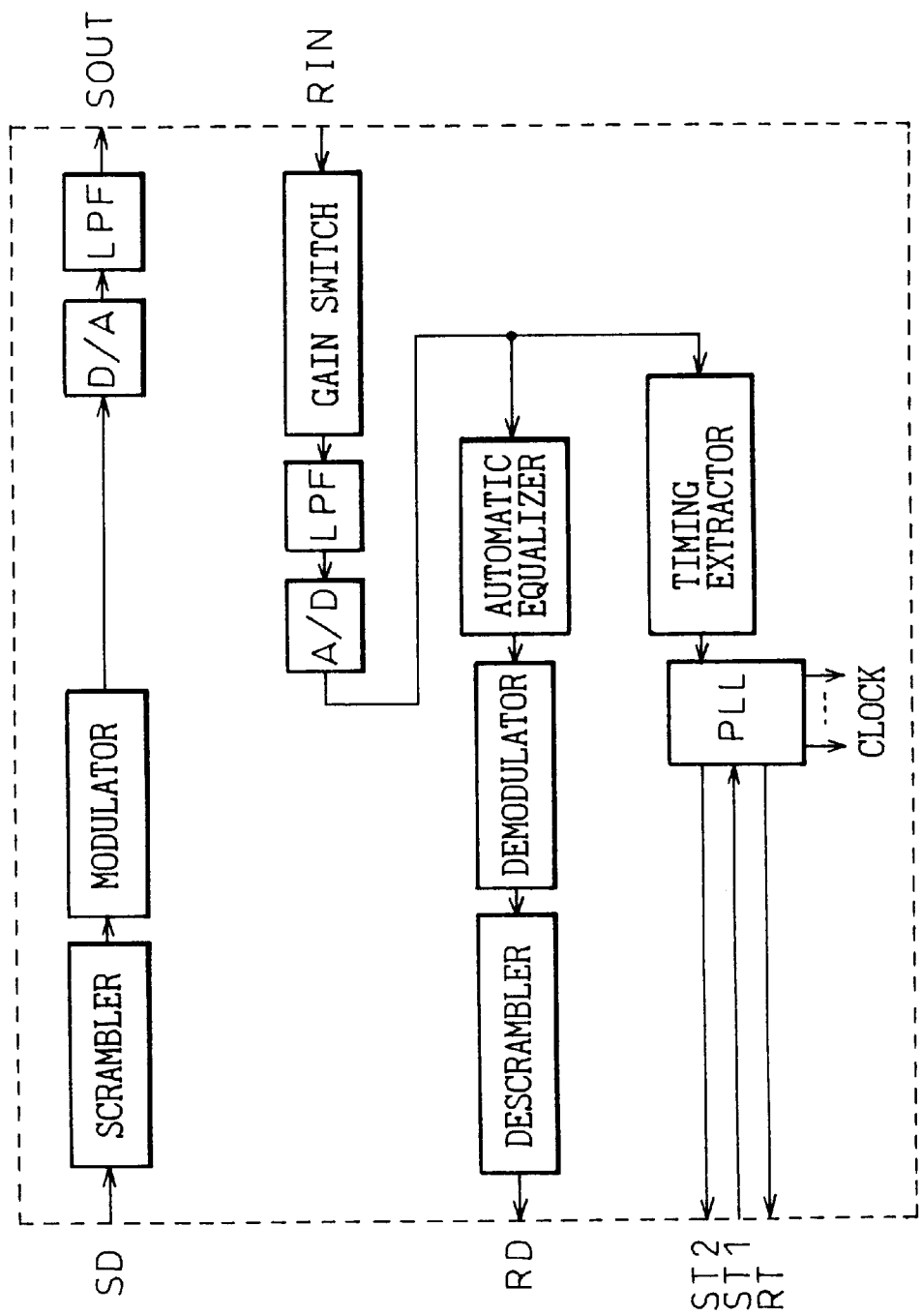
FIG. 7 is a block diagram showing one example of a data modem configuration incorporating the PLL circuit of the present invention.

FIG. 7 is a block diagram showing one example of a data modem configuration incorporating the PLL circuit of the present invention. When transmitted data SD, from an external device to the data modem, is synchronized to the clock ST1 of the external device, the transmitted data SD takes a meaningful value at a point where the clock signal ST1 changes from ON to OFF. In that case, the data modem needs to create an internal clock signal synchronized to the clock signal ST1 and supply it to the D/A converter, etc.

By using the PLL circuit of the present invention for synchronization with the ST1, the synchronization can be established with low jitter even when the ST1 has a high clock speed. In FIG. 7, the constituent elements other than the PLL circuit, that is, the scrambler, modulator, D/A converter, low-pass filter (LPF), gain switch, A/D converter, automatic equalizer, demodulator, descrambler, timing extractor, etc. are the same as those used in a conventional modem.

As described above, according to the present invention, there is provided a PLL circuit capable of suppressing jitter to a level lower than that attained with the prior art.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A PLL circuit for controlling a phase of an internal clock source based on a timing signal extracted from a received signal, comprising:
   a missing-pulse clock signal creation circuit for creating, based on an output signal of said clock source, a missing-pulse clock signal having a periodic missing-pulse portion;
   a phase comparator circuit for sampling said timing signal by using said missing-pulse clock signal; and
   a processing circuit for converting a signal value output from said phase comparator circuit into a phase difference, and for controlling the phase of said clock source based on said phase difference.

2. A PLL circuit as claimed in claim 1, wherein said clock source is a voltage-controlled oscillator, and based on said phase difference, said processing circuit controls an input voltage to said voltage-controlled oscillator.

3. A PLL circuit as claimed in claim 2, wherein a low-pass filter is provided between said processing circuit and said voltage-controlled oscillator.

4. A PLL circuit as claimed in claim 1, wherein said timing signal is extracted by a frequency dividing circuit which frequency-divides said received signal, and said missing-pulse clock signal creation circuit creates a missing-pulse clock signal having a higher speed than that of an output signal of said frequency dividing circuit.

5. A PLL circuit as claimed in claim 4, further comprising means for providing a variable divide-by ratio in said frequency dividing circuit.

6. A PLL circuit as claimed in claim 1, wherein said processing circuit stores a change in the output signal of said phase comparator circuit and converts a value stored in said shift register into said phase difference.

7. A PLL circuit as claimed in claim 1, wherein said processing circuit sums a control coefficient determined in accordance with the absolute value of said phase difference and a value obtained by integrating a control coefficient determined in accordance with the sign of said phase difference, and controls the phase of said clock source based on a value obtained by integrating said sum.

8. a data modem incorporating, as a circuit for achieving synchronization with a received signal from an external device, a PLL circuit that controls a phase of an internal clock source based on a timing signal extracted from said received signal, said PLL circuit comprising;

a missing-pulse clock signal creation circuit for creating, based on an output signal of said clock source, a missing-pulse clock signal having a periodic missing-pulse portion;

a phase comparator circuit for sampling said timing signal by using said missing-pulse clock signal; and a processing circuit for converting a signal value output from said phase comparator circuit into a phase difference, and for controlling the phase of said clock source based on said phase difference.

9. A phase control method for discriminating an excursion in a phase of a clock signal output from an internal clock source relative to the phase of a timing signal extracted from a received signal, and for controlling the phase of said clock signal relative to the phase of said timing signal, based on the result of said phase excursion discrimination, comprising the steps of:

creating from said clock signal a missing-pulse clock signal having a clock signal OFF period periodically alternating with a clock signal ON period;

sampling said timing signal by using said missing-pulse clock signal; and discriminating the phase excursion of said clock signal relative to said timing signal, based on the ON/OFF state of said timing signal during the ON period of said missing-pulse clock signal.

10. A phase control method as claimed in claim 9, wherein said timing signal is frequency-divided using a prescribed divide-by ratio, and said frequency-divided timing signal is sampled using said missing-pulse clock signal.

* * * * *